United States Patent
Oshima

(10) Patent No.: US 11,990,447 B2
(45) Date of Patent: May 21, 2024

(54) SEMICONDUCTOR DEVICE AND POWER CONVERSION DEVICE

(71) Applicant: Mitsubishi Electric Corporation, Tokyo (JP)

(72) Inventor: Isao Oshima, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 255 days.

(21) Appl. No.: 17/484,959

(22) Filed: Sep. 24, 2021

(65) Prior Publication Data

US 2022/0013493 A1 Jan. 13, 2022

Related U.S. Application Data

(62) Division of application No. 16/757,716, filed as application No. PCT/JP2018/001595 on Jan. 19, 2018, now Pat. No. 11,211,355.

(51) Int. Cl.
*H01L 23/00* (2006.01)

(52) U.S. Cl.
CPC ............. *H01L 24/83* (2013.01); *H01L 24/32* (2013.01); *H01L 2224/32225* (2013.01); *H01L 2224/83051* (2013.01); *H01L 2224/83141* (2013.01); *H01L 2224/83191* (2013.01); *H01L 2224/83192* (2013.01)

(58) Field of Classification Search
CPC ........ H01L 24/83; H01L 24/32; H01L 25/072
See application file for complete search history.

(56) References Cited

U.S. PATENT DOCUMENTS

| | | | |
|---|---|---|---|
| 6,521,983 B1 | 2/2003 | Yoshimatsu et al. | |
| 8,236,666 B2 * | 8/2012 | Hiramatsu | H01L 23/562 |
| | | | 438/455 |
| 8,981,552 B2 * | 3/2015 | Shimoike et al. | 257/288 |
| 10,121,732 B2 | 11/2018 | Kimura et al. | |
| 2003/0102570 A1 * | 6/2003 | Imasu et al. | 257/778 |

FOREIGN PATENT DOCUMENTS

| DE | 10 2014 105 957 B3 | 6/2015 |
|---|---|---|
| EP | 0 712 153 A2 | 5/1996 |
| JP | 2001-298033 A | 10/2001 |

(Continued)

OTHER PUBLICATIONS

An Office Action mailed by China National Intellectual Property Administration dated Mar. 17, 2023, which corresponds to Chinese Patent Application No. 201880086471.5 and is related to U.S. Appl. No. 17/484,959; with English language translation.

(Continued)

*Primary Examiner* — Dale E Page
*Assistant Examiner* — Wilner Jean Baptiste
(74) *Attorney, Agent, or Firm* — Studebaker & Brackett PC

(57) ABSTRACT

A first alignment resin (4) is formed in an annular shape on an electrode (3) of an insulating substrate (1). First plate solder (5) having a thickness thinner than that of the first alignment resin (4) is arranged on the electrode (3) on an inner side of the annular shape of the first alignment resin (4). A semiconductor chip (6) is arranged on the first plate solder (5). The first plate solder (5) is made to melt to bond a lower surface of the semiconductor chip (6) to the electrode (3).

2 Claims, 4 Drawing Sheets

(56) References Cited

FOREIGN PATENT DOCUMENTS

| JP | 2005-026628 A | 1/2005 |
| JP | 2017-204575 A | 11/2017 |

OTHER PUBLICATIONS

An Office Action; "Notice of Reasons for Refusal," mailed by the Japanese Patent Office dated Jan. 19, 2021, which corresponds to Japanese Patent Application No. 2019-565653 and is related to U.S. Appl. No. 16/757,716; with English language translation.
An Office Action; "Decision of Refusal," mailed by the Japanese Patent Office dated Mar. 30, 2021, which corresponds to Japanese Patent Application No. 2019-565653 and is related to U.S. Appl. No. 16/757,716 ; with English language translation.
International Search Report; Written Opinion; and Notification of Transmittal of the International Search Report and the Written Opinion of the International Searching Authority, or the Declaration issued in PCT/JP2018/001595; dated Apr. 10, 2018.
An Office Action mailed by China National Intellectual Property Administration dated Oct. 12, 2023, which corresponds to Chinese Patent Application No. 20188086471.5 and is related to U.S. Appl. No. 17/484,959; with English language translation.
An Office Action issued by the German Patent and Trademark Office on Feb. 29, 2024, which corresponds to German Patent Application No. 112018006906.0 and is related to U.S. Appl. No. 17/484,959; with English language translation.

\* cited by examiner

SEMICONDUCTOR DEVICE AND POWER CONVERSION DEVICE

CROSS-REFERENCE TO RELATED APPLICATIONS

This application is a Divisional of U.S. patent application Ser. No. 16/757,716 filed Apr. 20, 2020, which was the U.S. National Stage of International Application No. PCT/JP2018/001595 filed Jan. 19, 2018, the entire content of which is incorporated herein by reference.

FIELD

The present disclosure relates to a semiconductor device, a method for manufacturing a semiconductor device, and a power conversion device.

BACKGROUND

Along with development of industrial machine, electric railway and automobiles, an operating temperature of a semiconductor device used in such equipment increases as well. In recent years, a semiconductor device which operates also at a high temperature has been energetically developed, and the semiconductor device has become smaller in size, can withstand a higher voltage, and has higher current density. In particular, because a wideband gap semiconductor such as SiC and GaN has a greater band gap than that of Si, it is expected to realize a semiconductor device using a wideband gap semiconductor, which can withstand a higher voltage, which is smaller in size, which has higher current density, and which can operate at a higher temperature.

In such a semiconductor device, a semiconductor chip is bonded to an electrode on an insulating substrate using solder. At this time, it is possible to suppress wet spreading of melting solder by providing a solder resist around a position where the semiconductor chip is mounted (see, for example, PTL 1).

CITATION LIST

Patent Literature

[PTL 1] JP 2001-298033 A

SUMMARY

Technical Problem

However, with a typical solder resist, it is impossible to position plate solder before melting. Therefore, conventionally, a semiconductor chip and plate solder are positioned mainly using a carbon jig. However, to produce other types of semiconductor chips whose shapes and arrangement are different, because it is necessary to fabricate a jig each time, there are problems that production cost is high, and productivity is low.

The present invention has been made to solve problems as described above, and is directed to providing a semiconductor device which is capable of reducing production cost and improving productivity and a method for manufacturing a semiconductor device, and a power conversion device.

Solution to Problem

A method for manufacturing a semiconductor device according to the present disclosure includes: forming a first alignment resin in an annular shape on an electrode of an insulating substrate; arranging first plate solder having a thickness thinner than that of the first alignment resin on the electrode on an inner side of the annular shape of the first alignment resin; arranging a semiconductor chip on the first plate solder; and making the first plate solder to melt to bond a lower surface of the semiconductor chip to the electrode.

Advantageous Effects of Invention

In the present disclosure, the first plate solder having a thickness thinner than that of the first alignment resin is arranged on the electrode on an inner side of the annular shape of the first alignment resin. By this means, it is possible to position the first plate solder using the first alignment resin without using a dedicated jig. As a result, it is possible to reduce production cost and improve productivity.

DESCRIPTION OF EMBODIMENTS

A semiconductor device, a method for manufacturing a semiconductor device, and a power conversion device according to the embodiments of the present disclosure will be described with reference to the drawings. The same components will be denoted by the same symbols, and the repeated description thereof may be omitted.

Embodiment 1

Figure 1:
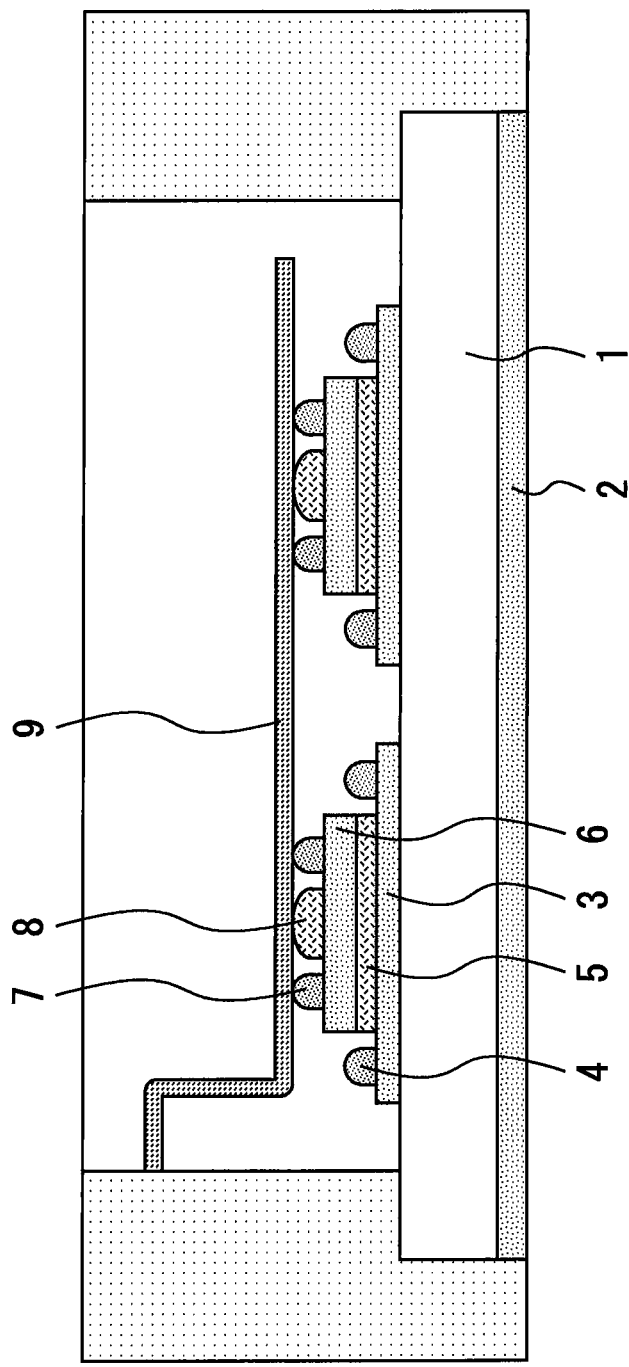
FIG. 1 is a cross-sectional view illustrating a semiconductor device according to Embodiment 1.
Figure 2:
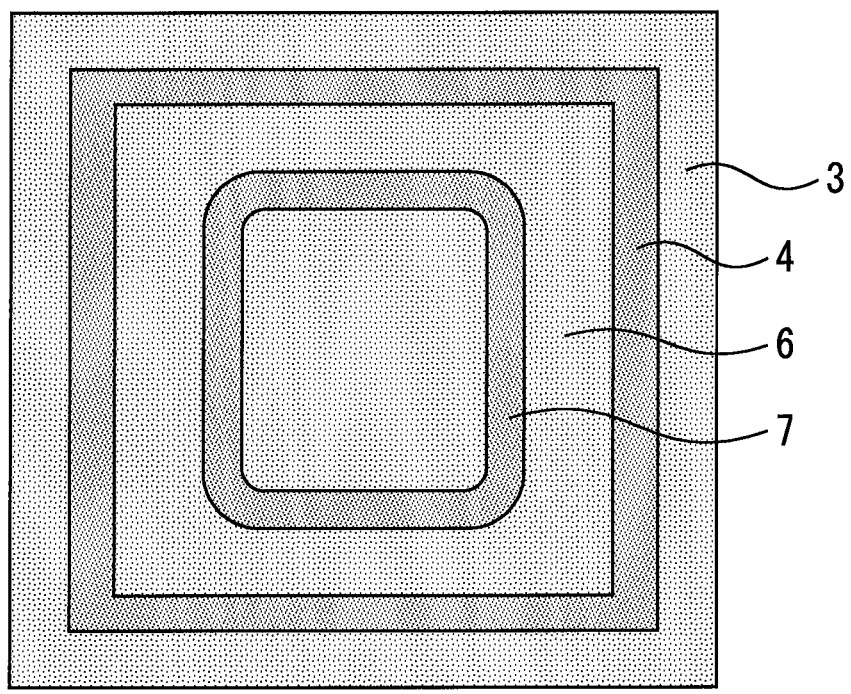
FIG. 2 is a plan view illustrating first and second alignment resins according to Embodiment 1.

FIG. 1 is a cross-sectional view illustrating a semiconductor device according to Embodiment 1. FIG. 2 is a plan view illustrating first and second alignment resins according to Embodiment 1. The semiconductor device according to the present embodiment is, for example, a power module which is widely used for home electrical appliance, for industrial use, for automobiles, for trains, or the like.

An electrode 2 is provided on a lower surface of an insulating substrate 1, and an electrode 3 is provided on an upper surface. A first alignment resin 4 is provided in an annular shape on the electrode 3 of the insulating substrate 1. A lower surface of a semiconductor chip 6 is bonded to the electrode 3 on an inner side of the annular shape of the first alignment resin 4 using first plate solder 5. The semiconductor chip 6 is an IGBT, MOSFET, Diode, or the like. A second alignment resin 7 is provided in an annular shape also on an upper surface of the semiconductor chip 6. A wiring electrode 9 is bonded to the upper surface of the semiconductor chip 6 using second plate solder 8.

Figure 3:
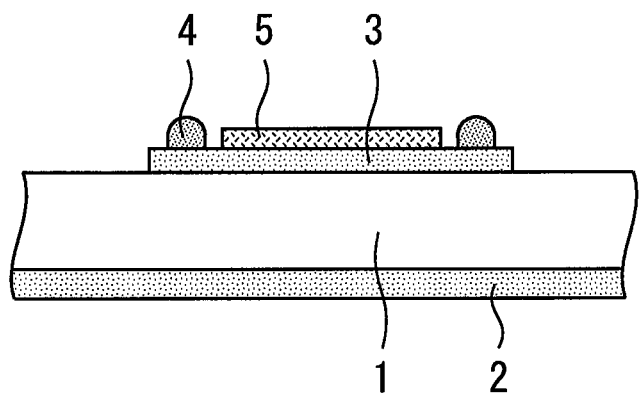
FIG. 3 is a cross-sectional view illustrating the method for manufacturing the semiconductor device according to Embodiment 1.
Figure 4:
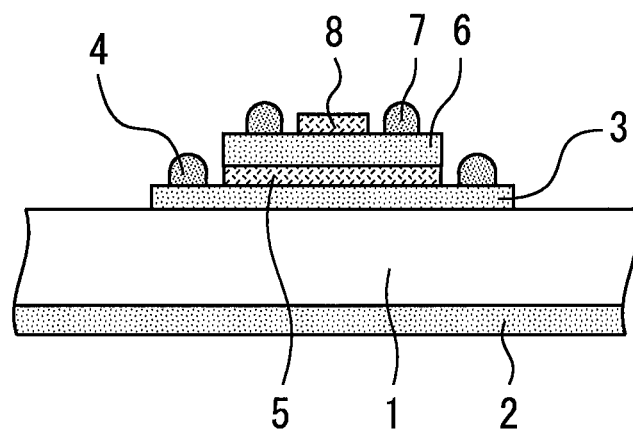
FIG. 4 is a cross-sectional view illustrating the method for manufacturing the semiconductor device according to Embodiment 1.

Subsequently, a method for manufacturing the semiconductor device according to the present embodiment will be described. FIG. 3 and FIG. 4 are cross-sectional views illustrating the method for manufacturing the semiconductor device according to Embodiment 1.

As illustrated in FIG. 3, the first alignment resin 4 is formed in an annular shape on the electrode 3 of the insulating substrate 1. Then, the first plate solder 5 having a thickness thinner than that of the first alignment resin 4 is arranged on the electrode 3 on an inner side of the annular shape of the first alignment resin 4.

Then, as illustrated in FIG. 4, the semiconductor chip 6 is arranged on the first plate solder 5. The first plate solder 5 is made to melt to bond the lower surface of the semiconductor chip 6 to the electrode 3. Then, the second alignment resin 7 is formed on the upper surface of the semiconductor chip 6. Then, second plate solder 8 having a thickness thinner than that of the second alignment resin 7 is arranged on the upper surface of the semiconductor chip 6 on an inner side of the annular shape of the second alignment resin 7.

Then, a wiring electrode 9 is arranged on the second plate solder 8. Then, as illustrated in FIG. 1, the second plate solder 8 is made to melt to bond the wiring electrode 9 to the upper surface of the semiconductor chip 6 using the second plate solder 8 which melts and swells by surface tension.

In the present embodiment, the first plate solder 5 having a thickness thinner than that of the first alignment resin 4 is arranged on the electrode 3 on an inner side of the annular shape of the first alignment resin 4. By this means, it is possible to position the first plate solder 5 using the first alignment resin 4 without using a dedicated jig. As a result, it is possible to reduce production cost and improve productivity. Further, it is possible to freely set a soldered position of the semiconductor chip 6 in accordance with types of products only by changing a position where the first alignment resin 4 is applied.

Further, outline of the semiconductor chip 6 is smaller than the annular shape of the first alignment resin 4, and is located on an inner side of the annular shape of the first alignment resin 4. By this means, it is possible to position the semiconductor chip 6 using the first alignment resin 4 without using a dedicated jig. Further, it is possible to position the semiconductor chip 6 without being affected by warpage of the insulating substrate 1.

Further, the second plate solder 8 having a thickness thinner than that of the second alignment resin 7 is arranged on the upper surface of the semiconductor chip 6 on an inner side of the annular shape of the second alignment resin 7. By this means, it is possible to position the second plate solder 8 without using a dedicated jig. Further, because it is possible to set a thickness of solder at a target value by controlling the thickness of the second alignment resin 7, it is possible to secure reliability.

Embodiment 2

Figure 5:
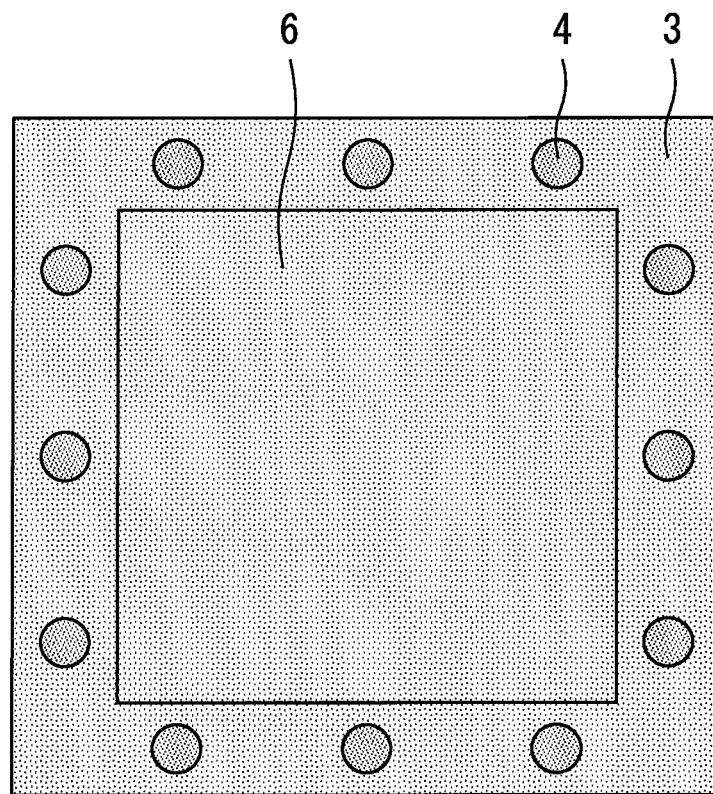
FIG. 5 is a plan view illustrating the first alignment resin according to Embodiment 2.

FIG. 5 is a plan view illustrating the first alignment resin according to Embodiment 2. While the first alignment resin 4 is linearly arranged over an entire circumference of the chip in FIG. 2, the first alignment resin 4 is arranged as a plurality of dots in FIG. 5. Other configurations are similar to those in Embodiment 1. Also in this case, it is possible to position the first plate solder 5. Further, it is possible to reduce cost by reducing an application amount of the resin, and improve productivity by reducing an application period.

Note that the second alignment resin 7 may be also arranged as a plurality of dots in a similar manner.

The semiconductor chip 6 is not limited to a chip formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved.

Embodiment 3

In this embodiment, the semiconductor device according to Embodiment 1 or 2 described above is applied to an electric power conversion device. The electric power conversion device is, for example, an inverter device, a converter device, a servo amplifier, or a power supply unit. Although the present disclosure is not limited to a specific electric power conversion device, a case where the present disclosure is applied to a three-phase inverter will be described below.

Figure 6:
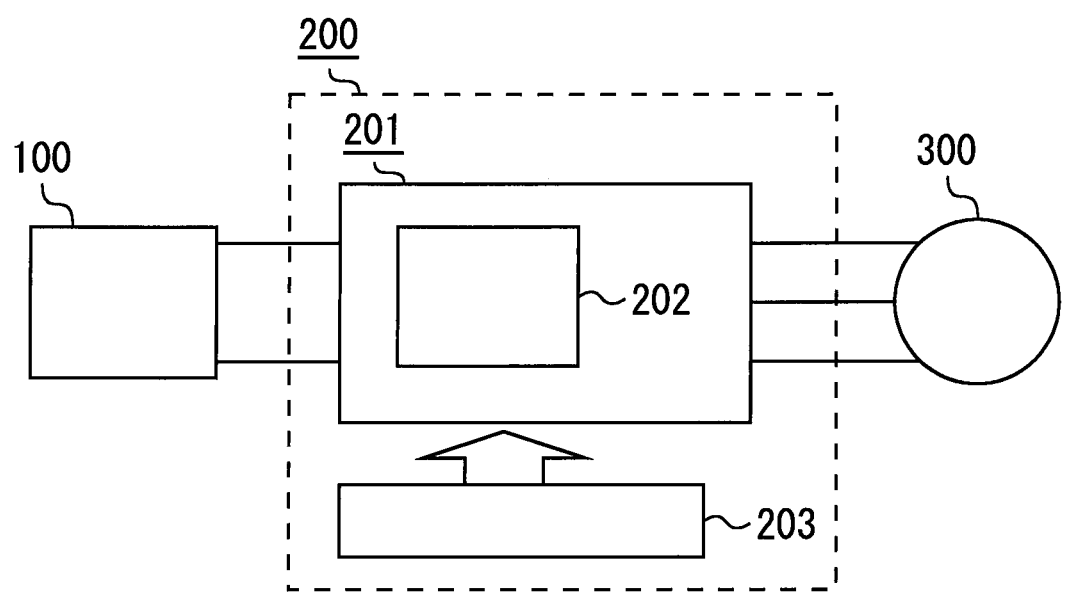
FIG. 6 is a block diagram illustrating a configuration of an electric power conversion system to which the electric power conversion device according to Embodiment 3 is applied.

FIG. 6 is a block diagram illustrating a configuration of an electric power conversion system to which the electric power conversion device according to Embodiment 3 is applied. This electric power conversion system includes a power supply 100, an electric power conversion device 200, and a load 300. The power supply 100 is a DC power supply and supplies DC power to the electric power conversion device 200. The power supply 100 can be composed of various components. For example, the power supply 100 can be composed of a DC system, a solar cell, or a storage battery, or may be composed of a rectifier or an AC/DC converter, which is connected to an AC system. Alternatively, the power supply 100 may be composed of a DC/DC converter that convers DC power output from a DC system to predetermined power.

The electric power conversion device 200 is a three-phase inverter connected to a node between the power supply 100 and the load 300, converts DC power supplied from the power supply 100 into AC power, and supplies the AC power to the load 300. The electric power conversion device 200 includes a main conversion circuit 201 that converts DC power into AC power and outputs the AC power, and a control circuit 203 that outputs a control signal for controlling the main conversion circuit 201 to the main conversion circuit 201.

The load 300 is a three-phase electric motor that is driven by AC power supplied from the electric power conversion device 200. The load 300 is not limited to a specific application. The load is used as an electric motor mounted on various electric devices, such as an electric motor for, for example, a hybrid vehicle, an electric vehicle, a railroad vehicle, an elevator, or an air-conditioner.

The electric power conversion device 200 will be described in detail below. The main conversion circuit 201 includes a switching device and a reflux diode (not illustrated). When the switching device is switched, the main conversion circuit 201 converts DC power supplied from the power supply 100 into AC power, and supplies the AC power to the load 300. The main conversion circuit 201 may have various types of specific circuit configurations. The main conversion circuit 201 according to this embodiment is a two-level three-phase full-bridge circuit, which can be composed of six switching devices and six reflux diodes connected in antiparallel with the respective switching devices. Each switching device and each reflux diode of the main conversion circuit 201 are composed of a semiconductor device 202 corresponding to any one of Embodiments 1 to 4 described above. Every two switching devices of the six switching devices are connected in series and constitute a vertical arm. Each vertical arm constitutes each phase (U-phase, V-phase, W-phase) of the full-bridge circuit. Output terminals of each vertical arm, i.e., three output terminals of the main conversion circuit 201, are connected to the load 300.

Further, the main conversion circuit 201 includes a drive circuit (not illustrated) that drives each switching device. The drive circuit may be incorporated in the semiconductor device 202. Another drive circuit different from the semiconductor device 202 may be provided. The drive circuit generates a drive signal for driving each switching device of the main conversion circuit 201, and supplies the generated drive signal to a control electrode of each switching device of the main conversion circuit 201. Specifically, the drive circuit outputs, to the control electrode of each switching device, a drive signal for turning on each switching device and a drive signal for turning off each switching device, according to the control signal output from the control circuit 203, which is described later. When the ON-state of each switching device is maintained, the drive signal is a voltage signal (ON signal) having a voltage equal to or higher than a threshold voltage of the switching device. When the OFF-state of each switching device is maintained, the drive signal is a voltage signal (OFF signal) having a voltage equal to or lower than the threshold voltage of the switching device.

The control circuit 203 controls each switching device of the main conversion circuit 201 so as to supply a desired power to the load 300. Specifically, the control circuit 203 calculates a period (ON period), in which each switching device of the main conversion circuit 201 is in the ON state, based on the power to be supplied to the load 300. For example, the main conversion circuit 201 can be controlled by a PWM control for modulating the ON period of each switching device depending on the voltage to be output. Further, the control circuit 203 outputs a control command (control signal) to the drive circuit included in the main conversion circuit 201 so that the ON signal is output to each switching device to be turned on and an OFF signal is output to each switching device to be turned off at each point. The drive circuit outputs the ON signal or OFF signal, as the drive signal, to the control electrode of each switching device according to the control signal.

In the electric power conversion device according to this embodiment, the semiconductor devices according to Embodiment 1 or 2 are applied as the semiconductor device 202. Accordingly, it is possible to reduce production cost and improve productivity.

While this embodiment illustrates an example in which the present disclosure is applied to a two-level three-phase inverter, the present disclosure is not limited to this and can be applied to various electric power conversion devices. While this embodiment illustrates a two-level electric power conversion device, the present disclosure can also be applied to a three-level or multi-level electric power conversion device. When power is supplied to a single-phase load, the present disclosure may be applied to a single-phase inverter. The present disclosure can also be applied to a DC/DC converter or an AC/DC converter when power is supplied to a DC load or the like.

Further, in the electric power conversion device to which the present disclosure is applied, the above-mentioned load is not limited to an electric motor. For example, the load may also be used as a power supply device for an electric discharge machine, a laser beam machine, an induction heating cooker, or a non-contact device power feeding system. More alternatively, the electric power conversion device may be used as a power conditioner for a photovoltaic power generating system, an electricity storage system, or the like.

REFERENCE SIGNS LIST 1 insulating substrate; 3 electrode; 4 first alignment resin; 5 first plate solder; 6 semiconductor chip; 7 second alignment resin; 8 second plate solder; 9 wiring electrode; 200 electric power conversion device; 201 main conversion circuit; 202 semiconductor device; 203 control circuit

The invention claimed is:

1. A semiconductor device comprising:
an insulating substrate including an electrode;
an alignment resin provided in an annular shape on the electrode;
solder having a thickness thinner than that of the alignment resin and arranged on the electrode on an inner side of the annular shape of the alignment resin; and
a semiconductor chip bonded to the electrode using the solder,
wherein the alignment resin is arranged as a plurality of dots around a periphery of the chip to form the annular shape.

2. An electric power conversion device comprising:
a main conversion circuit including the semiconductor device according to claim 1, converting input power and outputting converted power; and
a control circuit outputting a control signal for controlling the main conversion circuit to the main conversion circuit.

* * * * *